United States Patent [19]

Kuniyoshi et al.

[11] 4,441,206
[45] Apr. 3, 1984

[54] PATTERN DETECTING APPARATUS

[75] Inventors: Shinji Kuniyoshi, Tokyo; Akihiro Takanashi, Kokubunji; Toshiei Kurosaki, Tokyo; Sumio Hosaka, Hachioji; Yoshio Kawamura, Tokyo; Tsuneo Terasawa, Kokubunji, all of Japan

[73] Assignee: Hitachi, Ltd., Tokyo, Japan

[21] Appl. No.: 330,778

[22] Filed: Dec. 14, 1981

[30] Foreign Application Priority Data

Dec. 17, 1980 [JP] Japan ................................ 55-177282

[51] Int. Cl.$^3$ .......................... G06K 9/20; G06K 9/00; H04N 7/00
[52] U.S. Cl. ........................................ 382/08; 382/48; 358/101; 356/401
[58] Field of Search ............... 382/8, 45, 48; 356/400, 356/373, 375, 401; 364/489, 490, 491, 559; 250/561; 358/107, 101

[56] References Cited

U.S. PATENT DOCUMENTS 4,115,762 9/1978 Akiyama et al. ...................... 364/559
4,362,389 12/1982 Koizumi et al. ...................... 356/401
4,380,395 4/1983 Kuniyoshi et al. ................. 356/401

Primary Examiner—John C. Martin
Assistant Examiner—Erin A. McDowell
Attorney, Agent, or Firm—Antonelli, Terry & Wands

[57] ABSTRACT

A pattern detecting apparatus is disclosed which comprises, in order to detect the center of a positioning pattern on a sample with high accuracy in a wide range, means for illuminating the positioning pattern, means for defining an illumination range in which the positioning pattern is illuminated, means for focusing reflected light from the positioning pattern on a predetermined image plane, means for electrically detecting a bright and dark image on the image plane in accordance with positions on the image plane, means for removing a signal corresponding to the outside of the illumination range from the output signal of the detecting means and for holding, in place of the removed signal, a level of the output signal produced within the illumination range, and means for detecting a position of the center of the positioning pattern from the output signal of the holding means.

3 Claims, 12 Drawing Figures

PATTERN DETECTING APPARATUS

BACKGROUND OF THE INVENTION

The present invention relates to improvements in a pattern detecting apparatus used to precisely measure the position of a wafer, a mask or the like in a mask aligner which is employed in semiconductor production.

An example of the pattern detecting apparatus will be explained below with reference to FIG. 1 which shows a reduction projection aligner disclosed in a U.S. Pat. No. 4,380,395 assigned to the present assignee, and which is also used in the present invention. In a reduction projection aligner, a circuit pattern which is formed on a semiconductor wafer 4 in a preceding step, is overlaid with another circuit pattern on a reticle 2, which is to be newly formed on the wafer, through an exposing condenser lens 1. Usually, such processing is repeated successively for a plurality of reticles to form a desired circuit pattern on the semiconductor wafer 4. At each processing, it is required that one of the two circuit patterns is aligned to the other with an accuracy of less than 1 μm. In the reduction projection aligner shown in FIG. 1, the above-mentioned positioning is made in such a manner that the position of a positioning pattern on the semiconductor wafer 4 is detected and a relative movement is made between the wafer 4 and the reticle 2 so that the reticle 2 having the circuit pattern to be newly formed is accurately aligned to the wafer 4.

In more detail, the positioning reference pattern (which is omitted in FIG. 1 but is indicated by reference numeral 4' in FIG. 2) on the semiconductor wafer 4 is locally illuminated by means of a light guide 6. Light reflected from the positioning pattern passes through a reduction lens 3, a through hole 5 provided in a reticle holder 12, the reticle 2 and a magnifying optical system 7, and is then imaged on a movement plane on which a uniaxial movable table 10 provided with a slit 8 is moved, to form an enlarged image of the positioning pattern. At this time, if the illumination light given by the light guide 6 for detecting the positioning pattern is thrown on a wide region around the positioning pattern, a photoresist in the illuminated region is exposed to the light and therefore the fabrication of devices is subjected to great restrictions, even in the case where it is not required to provide a reference pattern on the reticle 2 as in the reduction projection aligner shown in FIG. 1. Therefore, it is required to retrict the light for detecting the positioning pattern by the through hole 5 provided in the reticle holder 12 or a shading pattern 5' (namely, a shading aperture) on the reticle 2 so that the light illuminates a small region on the semiconductor wafer 4, for example, a region having dimensions of 40 μm by 40 μm. In the following explanation, there will be shown only the case where the light for detecting the positioning pattern is restricted by the shading pattern 5' on the reticle 2.

An image plane of the magnifying optical system 8 is scanned by the slit 8, and the intensity of light having passed through the slit 8 is detected and converted into an electric signal by a photomultiplier 9 in accordance with the displacement of the slit 8. At this time, the displacement of the slit 8 is measured by a linear encoder 11.

FIG. 2 shows a relative position at the image plane between the positioning pattern 4' (for example, a linear pattern having a width) on the semiconductor wafer 4 and the shading pattern 5' (for example, a rectangular pattern) on the reticle 2. When the photocomposite image of these patterns is scanned by the slit 8, such a detection signal as shown in FIG. 3 is obtained. In FIG. 3, the displacement X of the slit 8 is plotted as abscissa and the digital value Y, into which the analog output of the photomultiplier 9 indicating the intensity of light having passed through the slit is converted, is plotted as ordinate. The displacement of the slit 8 is measured by the linear encoder 11, and the output data at an i-th reading position provides a digital value $Y_i$. A signal varying region 22 at a central part of such an output signal corresponds to the positioning pattern 4' on the semiconductor wafer 4. Further, signal varying regions 21 and 23 at the peripheral parts of the region 22 correspond to both ends of the shading pattern 5' on the reticle 2.

In general, the image of the shading pattern 5' is excellent in contrast, and therefore it is easy to accurately detect the position of the image. On the other hand, the image of the positioning pattern 4' is inferior in contrast due to the fact that a photoresist is present on the semiconductor wafer 4. Accordingly, it is required to detect the position of the image of the positioning pattern 4' from such an output signal as shown in FIG. 3, for example, in a manner as disclosed in U.S. Pat. No. 4,115,762. That is, a given position $X_i$ of the slit 8 is taken as a virtual center, and m data on one side of the position $X_i$ are laid upon m data on the other side to calculate a value $$Z_i = \sum_{j=1}^{m} (Y_{i+j} - Y_{i-j})^2.$$

A position of the slit 8 which corresponds to the smallest one of many values of Z thus obtained, is used as the position of the center of the positioning pattern 4' on the semiconductor wafer 4.

However, the above-mentioned method has a drawback that it is impossible to accurately detect the position of the positioning pattern 4' on the semiconductor wafer 4 when the positioning pattern 4' on the semiconductor wafer 4 comes close to an end portion of the shading pattern 5' on the reticle 2 as in FIG. 4A which shows a relative position at the image plane between the patterns 4' and 5'. A detection signal obtained at this time is shown in FIG. 4B. In this case, a value $Z_1$ of Z which is obtained by calculation when the center position $X_1$ of the signal varying region 22 corresponding to the positioning pattern 4' is used as the virtual center, becomes greater than a value $Z_2$ which is obtained when a position $X_2$ shown in FIG. 4B is used as the virtual center (see FIG. 4C). Accordingly, a position of the slit 8 which corresponds to the smallest one of values of Z, cannot be used as the center of the positioning pattern 4' on the semiconductor wafer 4. Therefore, according to the above-mentioned method, a pattern detecting apparatus can detect the positioning pattern only in a central range of about 10 μm width. Accordingly, in the case where the positioning pattern 4' on the semiconductor wafer 4 comes close to an end portion of the shading pattern 5' on the recticle 2 and therefore the position of the positioning pattern 4' departs from the detectable range of the pattern detecting apparatus as in the above-mentioned example, the above-mentioned method cannot detect a correct position of the positioning pattern 4' on the semiconductor wafer 4.

SUMMARY OF THE INVENTION

It is accordingly an object of the present invention to provide a pattern detecting apparatus which can solve the above-mentioned problem and can detect a pattern with high accuracy in a wide detection range.

In order to attain the above object, a pattern detecting apparatus according to the present invention comprises means for illuminating a positioning pattern formed on a sample with illumination light; means for defining a range illuminated with the illumination light, the positioning pattern being illuminated in the range; means for optically focusing reflected light from the positioning pattern on a predetermined image plane; means for electrically detecting a bright and dark image on the image plane in accordance with positions on the image plane; means for removing a signal corresponding to a region outside the illuminated range from a detection signal and for holding, in place of the removed signal, a level of the detection signal produced within the illuminated range, the detection signal being obtained by the detecting means; and means for detecting a position of the center of the positioning pattern from an output signal of the holding means.

According to the present invention having the above-mentioned characteristic construction, even if a positioning pattern on a semiconductor wafer lies in close proximity to a shading pattern on a reticle when viewed at an image plane, the position of the center of the positioning pattern on the semiconductor wafer can be detected, since a signal from a shading region of the shading pattern is converted into a predetermined level and then the position of the center of the positioning pattern is detected on the basis of a converted detection signal. Thus, the position of the center of the positioning pattern can be detected over a wide range.

DESCRIPTION OF THE PREFERRED EMBODIMENT

Figure 1:
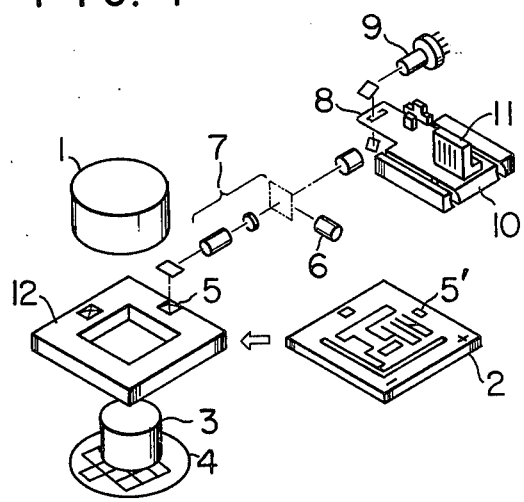
FIG. 1 is a schematic view showing an example of a reduction projection aligner.
Figure 2:
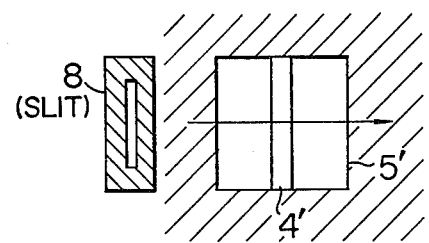
FIG. 2 is a view showing a positional relation at an image surface between a positioning pattern formed on a semiconductor wafer and a shading pattern formed on a reticle.

FIG. 1 shows a reduction projection aligner and FIG. 2 shows the relation of a shading pattern, a positioning pattern and a slit. The parts of FIGS. 1 and 2 have been already described. Further reference is made to U.S. Pat. No. 4,380,395.

Figure 5:
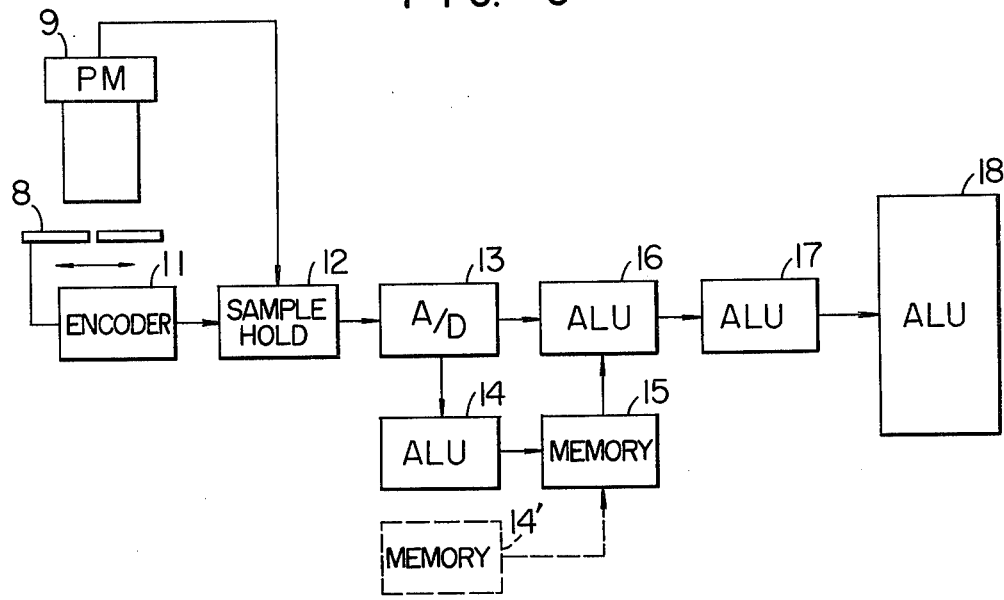
FIG. 5 is a block diagram showing an embodiment of a pattern detecting apparatus according to the present invention.

FIG. 5 is a block diagram showing an outline of an embodiment of a pattern detecting apparatus according to the present invention. As mentioned previously, the positioning pattern 4' on the semiconductor wafer 4 is locally illuminated, and reflected light from the positioning pattern 4' passes through the reduction lens 3 (working as a magnification lens), the reticle 2 and the magnifying optical system 7, and is then imaged on a movement plane on which the uniaxial movable table 10 provided with the slit 8 is moved, to form the enlarged image of the positioning pattern (refer to FIG. 1). The image plane of the magnifying optical system 7 is scanned by the slit 8 in the direction indicated with arrows, as shown in FIG. 5. The light intensity having passed through the slit 8 is detected by the photomultiplier 9 in accordance with the movement of the slit 8 to be converted into an electric signal. At this time, the position of the slit 8 is pulsized and measured by the linear encoder 11. The output of the photomultiplier 9 is sampled by a sample-hold circuit 12 in accordance with the output pulse of the linear encoder 11. An analog value held by the sample-hold circuit 12 is digitized by an analog-to-digital converter 13.

Figure 3:
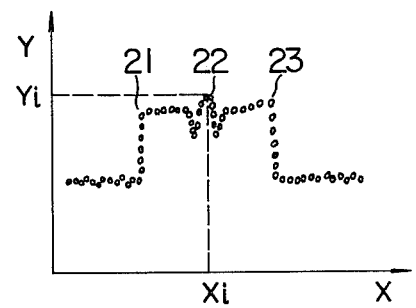
FIG. 3 is a graph showing a relation between the displacement of a slit and the detection signal indicating the light intensity having passed through the slit.
Figure 4A:
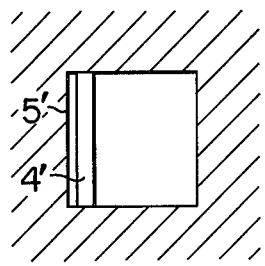
FIGS. 4A and 4C are views for explaining the drawback of a conventional pattern detecting apparatus.
Figure 4B:
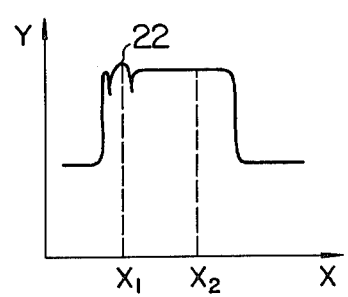
Figure 4C:
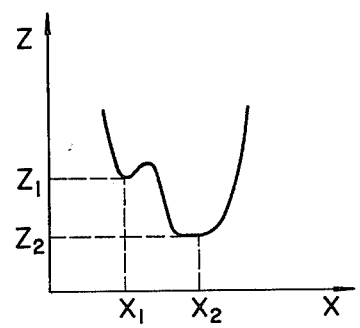
Figure 6:
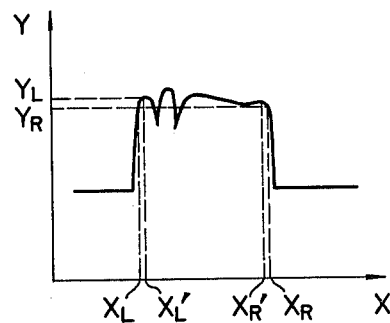
FIG. 6 is a graph showing a relation between the displacement of a slit and a detection signal obtained by the embodiment shown in FIG. 5.
Figure 7:
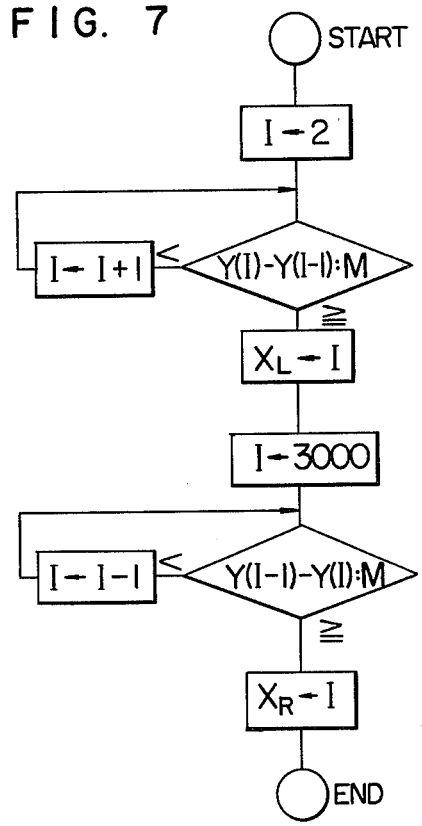
FIG. 7 is a flow chart for explaining an operational method carried out by the arithmetic circuit 14 shown in FIG. 5.

Digital values thus sampled are shown in FIG. 6. In FIG. 6, the displacement X of the slit 8 is plotted as abscissa, and the digital value Y, into which the analog output of the photomultiplier indicating the light intensity having passed through the slit is converted. is plotted as ordinate. Left and right end positions $X_L$ and $X_R$ of the shading pattern in FIG. 6 where an abrupt change in signal is generated, (namely, the positions corresponding to the regions 21 and 23 in FIG. 3) are calculated by an arithmetic circuit 14 shown in FIG. 5. A flow chart in FIG. 7 shows an actual example of the signal processing carried out by the operation circuit 14. Now, let us consider the case where 3,000 data are sampled and held. An output $Y_i$ corresponding to a position $X_i$ of the slit 8 is stored in a data area at one of 3,000 addresses. In ordinary cases, the light from outside portions of the shading pattern 5' is darked, but the reflected light from the surface of the semiconductor wafer 4 passes through the inside (namely, the aperture) of the shading pattern 5' and is then imaged on the slit 8. Therefore, an abrupt change in signal is generated at edge portions of the shading pattern 5'. Addresses in the data area are counted up successively from the first address to obtain a difference between two digital values of the signal $Y(I) - Y(I-1)$, and an address where the above difference exceeds for the first time a level M, is used as the left end position $X_L$. Similarly, the addresses are counted down successively from the 3,000-th address to obtain a difference $Y(I-1) - Y(I)$, and an address where this difference exceeds for the first time the level M, is used as the right end position $X_R$. The level M may be a value peculiar to the pattern detecting apparatus, or may be varied in accordance with the intensity of reflected light from the surface of the semiconductor wafer 4. Further, slit positions $X_L'$ and $X_R'$ are selected between the positions $X_L$ and $X_R$, for example, in such a manner that the positions $X_L'$ and $X_R'$ are spaced apart from the edges $X_L$ and $X_R$ of the shading pattern 5, respectively, by about 1 percent of the width of the shading pattern 5', namely, by 10 addresses in the example shown in FIG. 6. The signal intensity $Y_L$ corresponding to the slit position $X_L'$ and the signal intensity $Y_R$ corresponding to the slit position $X_R'$ are stored in a memory 15.

Values of the slit positions $X_L$ and $X_R$ can be more readily obtained in the reduction projection aligner disclosed in the previously-referred U.S. application Ser. No. 152,844, as compared with the present embodiment. That is, in the above-mentioned reduction projection aligner, the reticle 2 is accurately located at a predetermined position of the aligner proper, and therefore the shading pattern 5' on the reticle 2 is always placed at a predetermined position. As a result, a relative position between that origin of the pattern detecting apparatus which is fixed to the aligner proper, and an edge of the shading pattern 5' on the reticle 2 is kept constant, that is, peculiar to the aligner. Accordingly, the positional relation may be measured only once in the method shown in FIG. 7, and respective values of the positions $X_L$ and $X_R$ obtained at this time are stored in a memory 14' as the values peculiar to the aligner. Respective values of the positions $X_L'$ and $X_R'$ are obtained from the values of the positions $X_L$ and $X_R$ thus stored, and the digital values $Y_L$ and $Y_R$ of the output of the photomultiplier 9 corresponding respectively to the positions $X_L'$ and $X_R'$ are stored in the memory 15.

Figure 8:
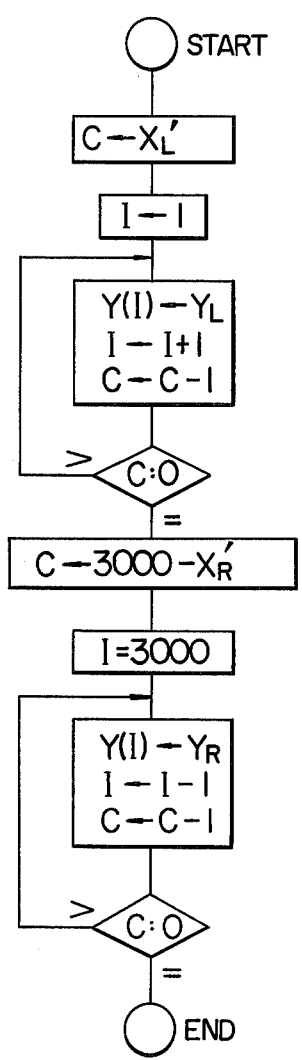
FIG. 8 is a flow chart for explaining an operation method carried out by the arithmetic circuit 16 shown in FIG. 5.
Figure 9A:
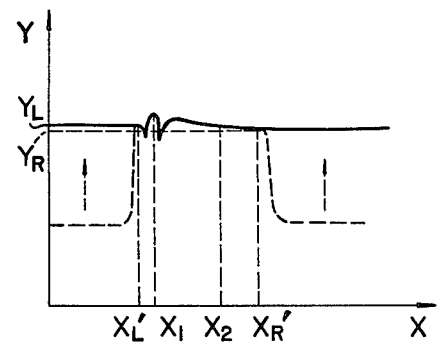
FIGS. 9A and 9B are views for explaining a method of processing the detection signal shown in FIG. 5.

These quantities thus obtained and digital values from the analog-to-digital converter 13 are supplied to an arithmetic circuit 16. Operations performed in the arithmetic circuit 16 will be explained below in detail, with reference to a flow chart shown in FIG. 8. Let us consider the case where 3,000 data are sampled and held by the sample-hold circuit 12, as mentioned previously. Further, it is assumed that the positions $X_L$ and $X_R$ indicating both ends of the shading pattern 5' are the 1,000-th address and 2,000-th address, respectively. Then, the positions $X_L'$ and $X_R'$ are the 1,010-th address and 1,990-th address, respectively. When the value of $X_L'$ is taken as the contents C of a counter, the value of C is equal to 1,010. Then, all values of Y at the first, second, . . . , and 1,010-th addresses are replaced by $Y_L$ in accordance with the flow chart shown in FIG. 8. Similarly, when the value of 3,000-$X_R'$ is taken as the contents C of the counter, the value of C is equal to 1,010. Thus, all values of Y at the 1,991-st, 1,992-nd, . . . and 3,000-th addresses are replaced by $Y_R$. That is, all of the outputs of the photomultiplier 9 corresponding to slit positions smaller than the slit position $X_L'$ are made equal to $Y_L$, and all of the outputs corresponding to slit positions greater than the slit position $X_R'$ are made equal to $Y_R$. Thus, such a signal as indicated by a solid line in FIG. 9A is obtained. In more detail, a signal indicated by a dotted line in FIG. 9A, namely, the detection signal shown in FIG. 6 is converted into the signal which is indicated by the solid line in FIG. 9A.

Thereafter, the position of the image of the positioning pattern 4' is determined in the previously-mentioned manner, that is, by an arithmetic circuit 17 for folding a detection signal symmetrically about a predetermined point to obtain the degree of matching (overlapping) between the two portions of the detection signal on the both side of the sample point, and an arithmetic circuit 18 for determining a point where the degree of matching is highest. In more detail, a position $X_i$ of the slit 8 is taken as the virtual center, and 2n data on both sides of the virtual center are folded in such a manner that n data on one side of the virtual center are laid upon n data on the other side, in order to calculate a value $$Z_i = \sum_{j=1}^{n} (Y_{i+j} - Y_{i-j})^2.$$

Figure 9B:
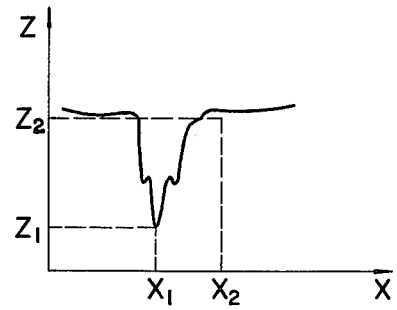

When the number n is made almost equal to the number of data corresponding to the width of the image of the shading pattern 5', a position of the center of the image of the positioning pattern 4' located at random in the image of the shading pattern 5' is given as a slit position indicating a minimum value of Z in FIG. 9B, which shows many values of Z obtained by the above calculation. That is, a virtual center $X_1$ which gives the smallest one of values of Z obtained by the calculation, indicates the center of the image of the positioning pattern 4'.

While, in the conventional pattern detecting apparatus, the positioning pattern 4' on the semiconductor wafer 4 could be detected only in a range up to about 10 μm, the positioning pattern 4' could be detected in a range up to about 30 μm in the present embodiment, in case when the shading pattern was 40 μm square. That is, the detection range is made about three times larger than the conventional detection range.

In the above-mentioned embodiment, a pattern detecting apparatus according to the present invention is combined with the reduction projection aligner. However, the present invention can be used not only in the reduction projection aligner, but also in the case where a detection signal indicating respective positions of two different bodies is generated, and then a part of the detection signal indicating the position of one of the bodies is removed from the detection signal to detect the position of the other body with high accuracy in a wide detection range.

We claim:

1. A pattern detecting apparatus comprising:
    means for illuminating a positioning pattern formed on a sample with illumination light;
    means for defining a range illuminated with said illumination light, said positioning pattern being illuminated in said range;
    means for optically focusing reflected light from said positioning pattern on a predetermined image plane;
    means for electrically detecting a bright and dark image on said image plane in accordance with positions on said image plane;
    means for removing a signal corresponding to a region outside said illumination range from a detection signal and for holding, in place of said removed signal, a level of said detection signal produced within said illumination range of said illumination light, said detection signal being obtained by said detecting means; and
    means for detecting a position of the center of said positioning pattern from an output signal of the holding means.

2. A pattern detecting apparatus according to claim 1, wherein said defining means is an aperture provided in a shading plate.

3. A pattern detecting apparatus according to claim 1, wherein said detecting means includes a slit for scanning said image plane and a photodetector for converting the intensity of light having passed through said slit into an electric signal in accordance with the position of said slit.

* * * * *